United States Patent
Delke et al.

(10) Patent No.: US 11,018,625 B1
(45) Date of Patent: May 25, 2021

(54) FREQUENCY REFERENCE GENERATOR

(71) Applicant: NXP B.V., Eindhoven (NL)

(72) Inventors: Alexander Sebastian Delke, Enschede (NL); Mark Stefan Oude Alink, Delden (NL); Anne Johan Annema, Hengelo (NL); Yanyu Jin, Eindhoven (NL); Jos Verlinden, Wachtendonk (DE); Bram Nauta, Borne (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/804,245

(22) Filed: Feb. 28, 2020

(51) Int. Cl.
*H03B 5/04* (2006.01)
*H03B 5/24* (2006.01)

(52) U.S. Cl.
CPC .............. *H03B 5/04* (2013.01); *H03B 5/24* (2013.01); *H03B 2200/001* (2013.01); *H03B 2200/0008* (2013.01)

(58) Field of Classification Search
CPC ........................................................ H03B 5/04
USPC ............................................................ 331/66
See application file for complete search history.

(56) References Cited

U.S. PATENT DOCUMENTS

| | | | |
|---|---|---|---|
| 6,091,304 A | 7/2000 | Harrer et al. | |
| 6,097,258 A | 8/2000 | Van Veenendaal | |
| 7,030,718 B1 | 4/2006 | Scherer | |
| 7,777,585 B1 | 8/2010 | Sonntag | |
| 7,872,541 B2 | 1/2011 | McCorquodale et al. | |
| 8,884,718 B2 | 11/2014 | Sinoussi et al. | |
| 2001/0015681 A1 | 8/2001 | Hino | |
| 2003/0193372 A1 | 10/2003 | Huang | |
| 2004/0092242 A1 | 5/2004 | Endo | |
| 2005/0206460 A1 | 9/2005 | Korner | |
| 2007/0176705 A1* | 8/2007 | Sutardja | H03L 1/026 331/176 |
| 2011/0018642 A1 | 1/2011 | Li et al. | |

(Continued)

OTHER PUBLICATIONS

McCorquodale, Michael S. et al., "A 0.5-to-480MHz Self-Referenced CMOS Clock Generator with 90ppm Total Frequency Error and Spread-Spectrum Capability," IEEE International Solid-State Circuits Conference (ISSCC), Feb. 2008, pp. 350-351.

(Continued)

*Primary Examiner* — Joseph Chang
(74) *Attorney, Agent, or Firm* — Rajeev Madnawat

(57) ABSTRACT

A frequency reference generator includes (i) an integrated frequency source having drive circuitry that drives a resonant (e.g., non-trimmable LC) tank to generate an oscillator signal, (ii) at least one temperature sensor that generates at least one measured temperature signal, and (iii) a frequency-adjustment circuit that adjusts the oscillator signal frequency to generate the frequency reference based on the measured temperature signal and a (e.g., sample-specific) mapping from temperature to a corresponding frequency-adjustment parameter (e.g., a divisor value for a fractional frequency divider). In some embodiments, a Colpitts oscillator generates the oscillator signal based on the measured temperature signal, where the Colpitts oscillator has voltage/temperature-compensation circuitry that compensates for variations in power supply voltage and operating temperature. Such frequency reference generators achieve substantial PVT insensitivity with as little as a single 1T-trim or even no trim at all.

19 Claims, 11 Drawing Sheets

(56) References Cited

U.S. PATENT DOCUMENTS

| | | | |
|---|---|---|---|
| 2012/0200364 | A1 | 8/2012 | Iizuka et al. |
| 2017/0179961 | A1* | 6/2017 | Itasaka .................. H03L 1/04 |
| 2018/0198451 | A1* | 7/2018 | Jung ..................... H03L 1/022 |
| 2018/0241401 | A1* | 8/2018 | Aylward ............... H03L 1/027 |
| 2018/0323316 | A1 | 11/2018 | Konkapaka |
| 2019/0028106 | A1 | 1/2019 | Annema et al. |
| 2019/0109574 | A1 | 4/2019 | Ilkov et al. |
| 2020/0343856 | A1* | 10/2020 | Aboudina ............. H03L 1/026 |

OTHER PUBLICATIONS

Ates, E O. et al., "Fully Integrated Frequency Reference With 1.7 ppm Temperature Accuracy Within 0-80° C.," IEEE Journal of Solid-State Circuits, Nov. 2013, pp. 2850-2859, vol. 48, No. 11.

Greiner, P. et al., "A System-on-Chip Crystal-Less Wireless Sub-GHz Transmitter," IEEE Transactions on Microwave Theory and Techniques, Mar. 2018, pp. 1431-1439, vol. 66, No. 3.

Gaied, D. et al., "A CMOS LC-Based Frequency Reference with ±40ppm Stability from—40° C. to 105° C.," 2015 Joint Conference of the IEEE International Frequency Control Symposium & the European Frequency and Time Forum, 2015, pp. 151-154, Denver, US.

Groszkowski, J., "The Interdependence of Frequency Variation and Harmonic Content, and the Problem of Constant-Frequency Oscillators," Proceedings of the Institute of Radio Engineers, Jul. 1933, pp. 958-981, vol. 21, No. 7.

McCorquodale, M. S. et al., "A Silicon Die as a Frequency Source", 2010 IEEE International Frequency Control Symposium, Jun. 2010, pp. 103-108.

Notice of Allowance for U.S. Appl. No. 16/886,030, 9 pgs., (dated Nov. 18, 2020).

\* cited by examiner

FIG. 7    700

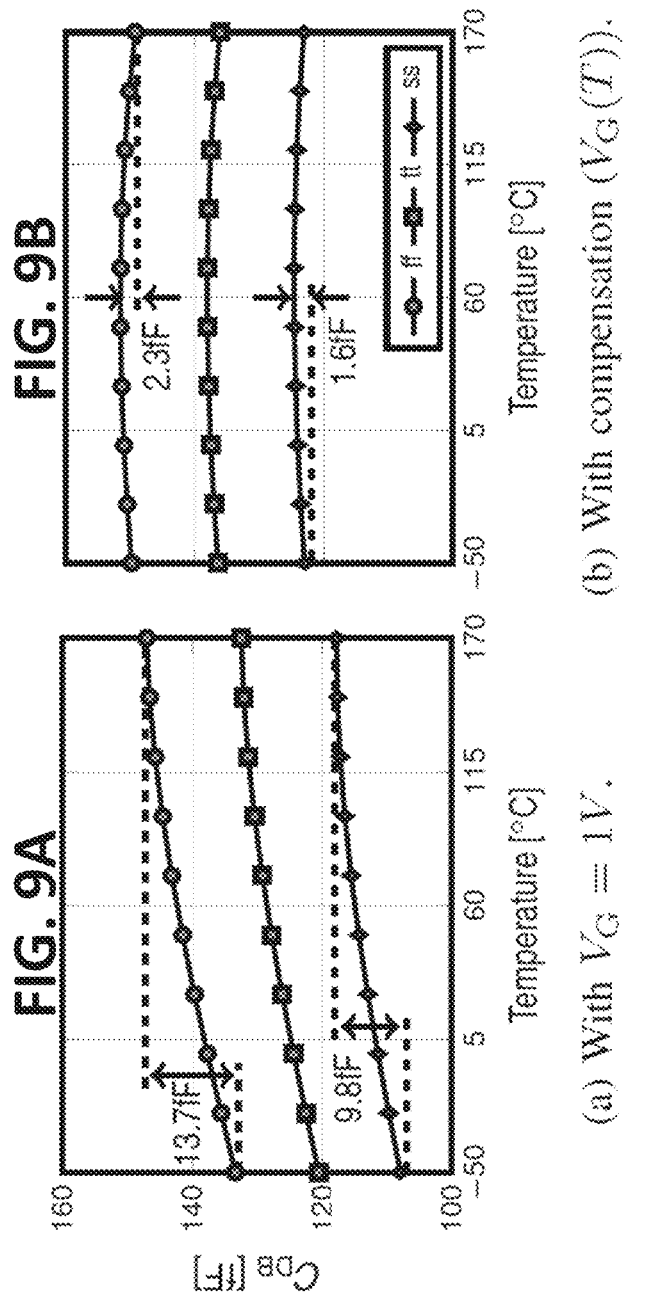
FIG. 9A (a) With $V_G = 1V$.
FIG. 9B (b) With compensation ($V_G(T)$).

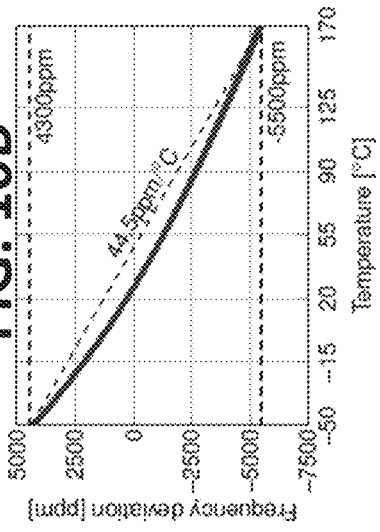
(a) $f_{osc}$ over temperature.
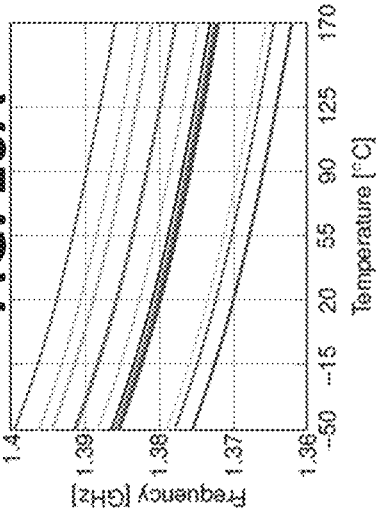
(b) Frequency deviation of $f_{osc}$ over temperature w.r.t. $f_{osc}$ at 25°C.
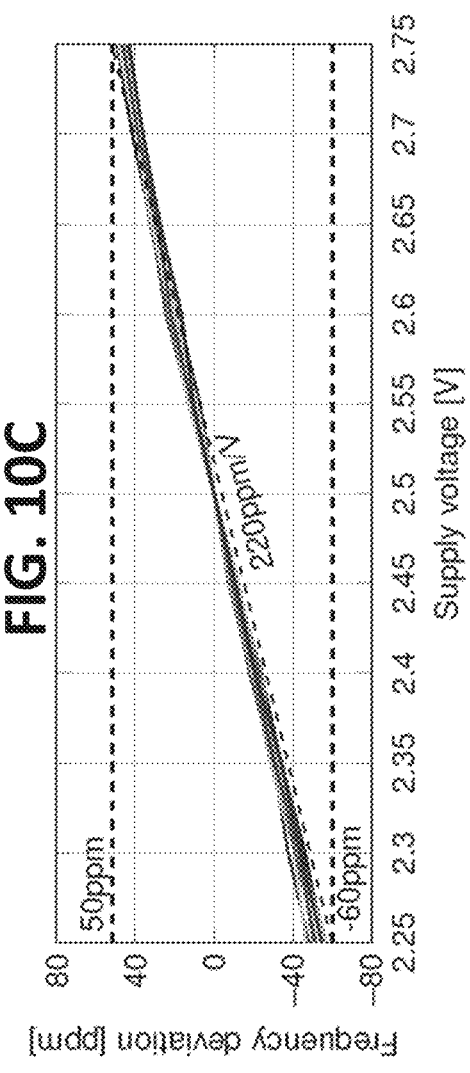
(c) Frequency deviation of $f_{osc}$ over supply voltage w.r.t. $f_{osc}$ at 2.5V.
FIG. 10A
FIG. 10B
FIG. 10C

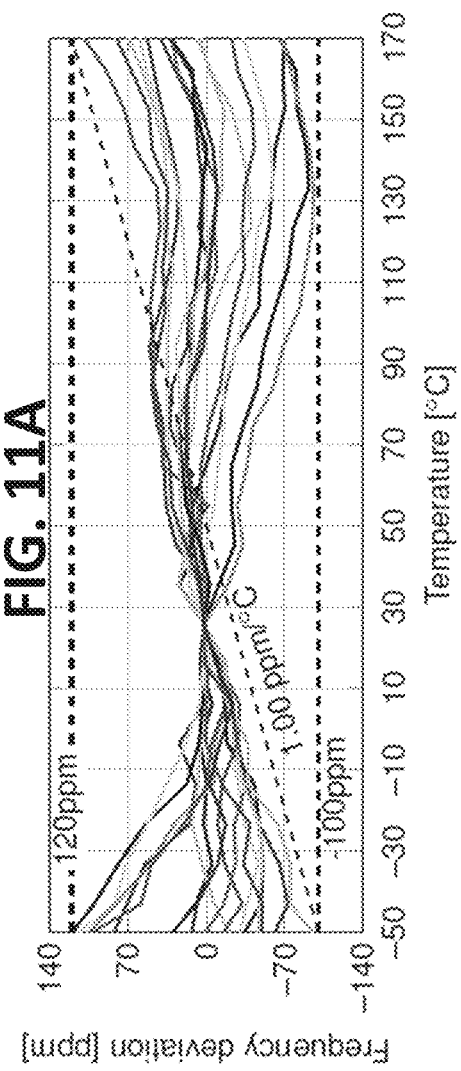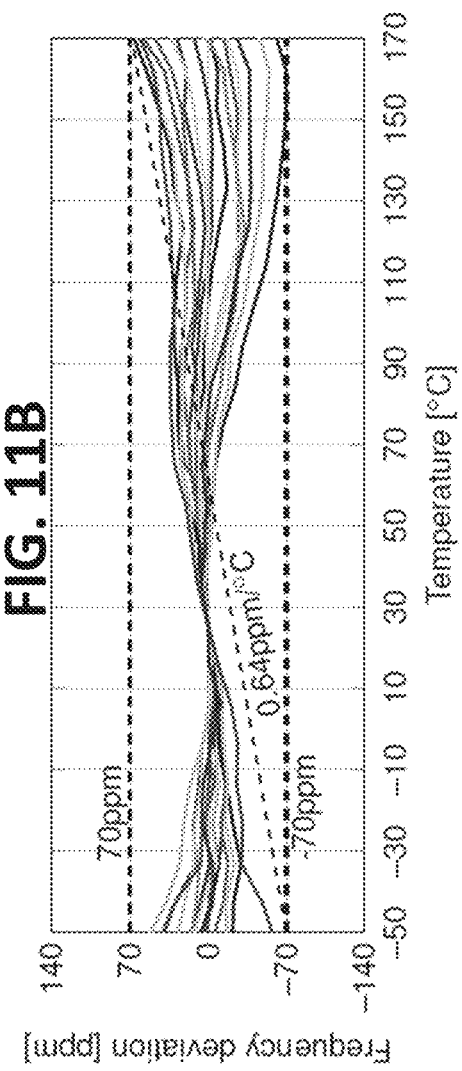

FREQUENCY REFERENCE GENERATOR

TECHNICAL FIELD

The present disclosure is related to electronics and more particularly to circuitry for generating frequency reference signals.

BACKGROUND

Frequency reference signals (also referred to as frequency references) compliant with wired communication standards (e.g., 10/100/1000 Ethernet) require ±100 ppm absolute frequency accuracy over their operating temperature. Wireless standards require even stricter accuracy. The traditional solution is to use bulky and relatively expensive quartz crystal oscillators, which have ppm-level accuracy over temperature and lifetime, thus requiring no or at most a very simple, single-temperature (1T) trim. In an attempt to eliminate the bulky crystal oscillator and move to fully integrated solutions, several on-chip frequency reference generators have been developed. However, passive and active on-chip components in the processing front-end have a significant process spread as well as temperature and lifetime dependency. For such designs, absolute frequency accuracy requires temperature trimming and re-trimming over time. The state-of-the-art integrated solutions either (i) use a 1T-trim that does not satisfy the absolute accuracy or (ii) achieve the required accuracy but only with an expensive multi-temperature trim or re-trimming over time. To realize a low-cost, high-accuracy, integrated frequency reference generator, minimizing process spread of frequency dependence on temperature ($TC_f$) and maintaining frequency stability over lifetime are indispensable.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

FIGS. 9A and 9B show simulated $C_{DB}$ versus temperature (i) with constant 1-V gate voltage $V_G$ and (ii) with temperature-compensated gate voltage $V_G(T)$, respectively, over process corners;

FIGS. 10A-10C show measured $f_{osc}$ and its frequency deviation over temperature and supply voltage for 16 samples; and FIGS. 11A-11B show measured frequency deviations after applying temperature correction polynomials and 1T-trimming at room temperature for 16 samples.

DETAILED DESCRIPTION

Frequency Reference Generator

Figure 1:
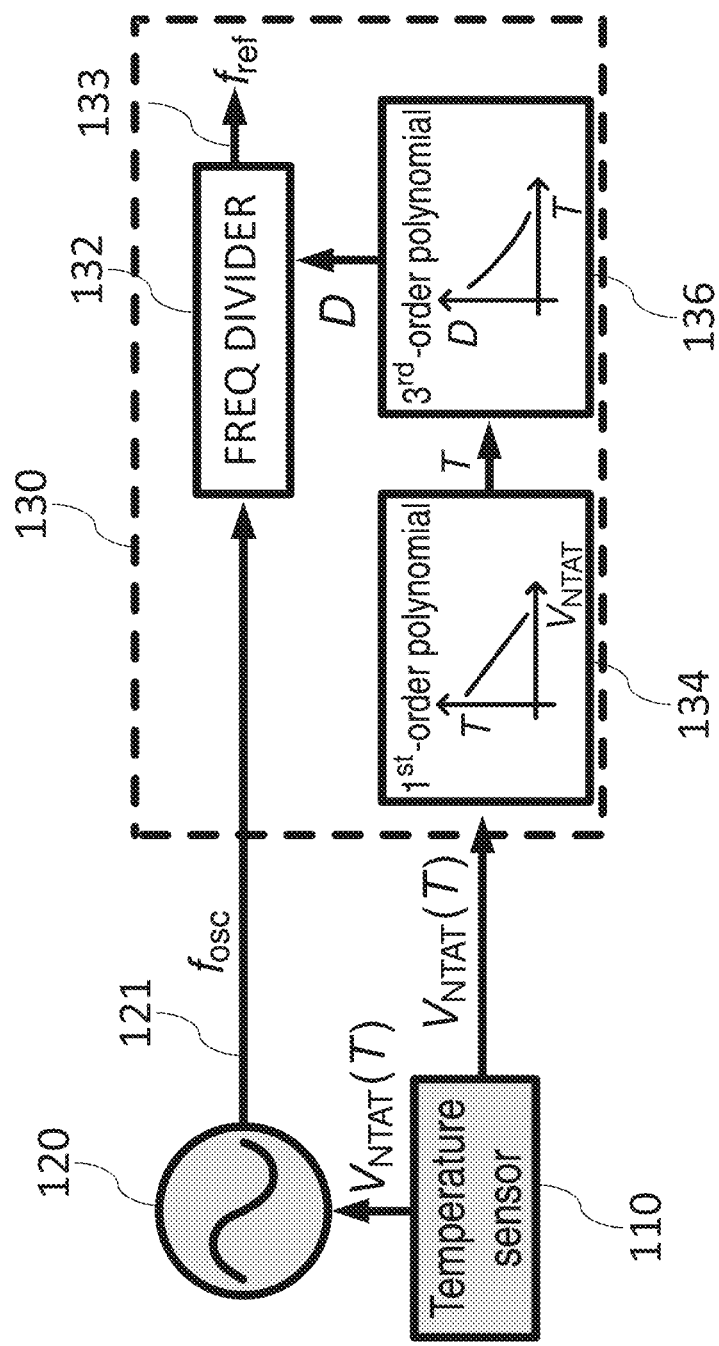
FIG. 1 is a high-level block diagram of a frequency reference generator according to certain embodiments of the disclosure.

FIG. 1 is a high-level block diagram of a frequency reference generator 100 according to certain embodiments of the disclosure. Frequency reference generator 100 has a temperature sensor 110, a frequency source 120, and frequency-adjustment circuitry 130, where a temperature measurement generated by the temperature sensor 110 is used to improve the stability of the frequency of the frequency source 120 and to control the operations of the frequency-adjustment circuitry 130. In particular, the temperature sensor 110 generates a DC voltage $V_{NTAT}(T)$ whose voltage level is dependent on the operating temperature of the frequency reference generator 100. Based on this sensed-temperature voltage $V_{NTAT}(T)$, the frequency source 120 generates an oscillator signal 121 having an oscillator frequency $f_{osc}$. Note that, although the frequency source 120 can function without the temperature sensor 110, as described further below, the sensed-temperature voltage $V_{NTAT}(T)$ enhances the oscillator performance of the frequency source 120 in terms of frequency stability. The frequency-adjustment circuitry 130 has a frequency divider 132 that divides the frequency $f_{osc}$ of the oscillator signal 121 by a divisor value D that is selected based on the sensed-temperature voltage $V_{NTAT}(T)$ to generate a frequency reference signal 133 having a desired reference frequency $f_{ref}$. Note that any reference frequency $f_{ref}$ lower than the oscillator frequency $f_{osc}$ can be generated by adjusting the divisor value.

Depending on the implementation, one or more of the elements of the frequency reference generator 100 may be implemented using integrated circuitry. For example, in some implementations, the temperature sensor 110 and the frequency source 120 may be fully integrated on the same integrated circuit (IC) die. Some of those implementations may also have some or all of the frequency-adjustment circuitry 130, such as the frequency divider 132, integrated on that same IC die.

The processing used to select the divisor value D based on the sensed-temperature voltage $V_{NTAT}(T)$ is represented in FIG. 1 as a first, linear (i.e., first-order) mapping 134 from voltage $V_{NTAT}$ to temperature T followed by a second, third-order mapping 136 from temperature T to divisor value D. Note that the first mapping 134 is not necessarily limited to being first order, and the second mapping 136 is not necessarily limited to being third order. In certain implementations, when at least the temperature sensor 110 and the frequency source 120 are integrated on the same IC die, multiple samples (i.e., instances) of that IC die are factory tested at different temperatures over the full operating-temperature range for the frequency reference generator 100 to determine values of the divisor value D that achieve frequency reference signals 133 having the desired reference frequency $f_{ref}$ at those different temperatures for those multiple samples. That data is then used to generate a first-order, sample-agnostic mapping from $V_{NTAT}(T)$ to T and a third-order, sample-agnostic mapping from T to D for a generic IC die. For every subsequent sample of the IC die, the sample is factory tested at a specific temperature (e.g., a standard room temperature) to determine the sample-specific divisor value D that achieves the desired reference frequency $f_{ref}$ at that specific temperature. The difference between that sample-specific divisor value D value and the corresponding divisor value D at the same temperature in the third-order, sample-agnostic mapping is then applied to the sample-agnostic mapping to generate a sample-specific, third-order mapping for that specific sample that is used as the third-order mapping 136 of FIG. 1, while the sample-agnostic mapping from $V_{NTAT}(T)$ to T is used as the first-order mapping 134 of FIG. 1.

In some implementations, the two mappings 134 and 136 of FIG. 1 are implemented using suitable memory that contains a single, sample-specific look-up table (LUT) that maps different sensed-temperature voltages $V_{NTAT}(T)$ directly to corresponding divisor values D or an arbitrary number of concatenated mappings. Depending on the implementation, the LUT may be implemented on-chip or off-chip. In addition, interpolation processing may be implemented (on-chip or off-chip) to generate values of the divisor value D for intermediate voltage levels $V_{NTAT}(T)$ that are not explicitly represented in the LUT. Alternatively, instead of a LUT, the mappings 134 and 136 could be implemented using two closed-form equations that sequentially map $V_{NTAT}(T)$ to T and T to D or a single closed-form equation that maps $V_{NTAT}(T)$ directly to D.

In this way, the frequency reference generator 100 of FIG. 1 is factory-trimmed for process variations and field-compensated for temperature variations. In other words, an individual IC die sample of the frequency reference generator 100 is tested in the factory to generate a sample-specific LUT that takes into account process variations between different samples, where that sample-specific LUT is then used during on-line operations of that sample (i.e., in the field) to take into account differences in the performance of that sample as a function of operating temperature. As described further below, the frequency reference generator 100 also handles variation in power supply voltage level. As a result, the frequency reference generator 100 of FIG. 1 is substantially insensitive to expected process, voltage, and temperature (PVT) variations over the lifetime of the generator.

Note that, for some implementations, the same LUT may be able to be used for all of the samples manufactured on the same substrate wafer or for all of the sample manufactured during the same batch. In those cases, the LUT would be wafer-specific or batch-specific instead of sample-specific, where the wafer-specific or batch-specific 1T-trimmed LUT would be generated by factory testing a single sample for each wafer or batch. Furthermore, in some implementations, a single sample-agnostic LUT may be sufficient for all of the samples. In that case, no factory testing would be needed and the sample-agnostic LUT would be used with no trimming.

Temperature Sensor

Figure 2:
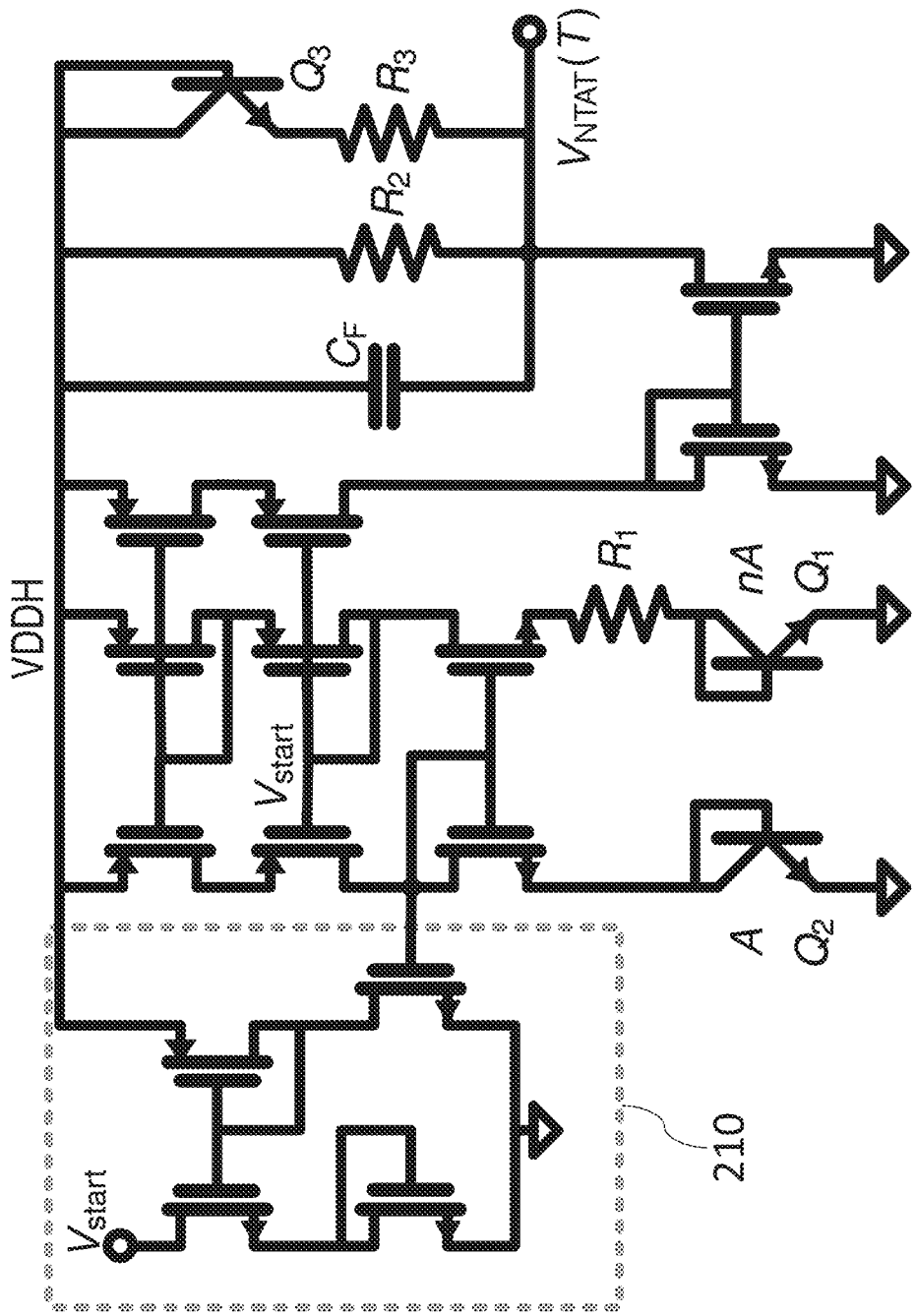
FIG. 2 is a schematic circuit diagram of a temperature sensor that can be used to implement the temperature sensor of FIG. 1 according to certain embodiments of the disclosure.

FIG. 2 is a schematic circuit diagram of a temperature sensor 200 (including its start-up circuit 210) that can be used to implement the temperature sensor 110 of FIG. 1 according to certain embodiments of the disclosure. The temperature sensor 110 of FIG. 2 is an NTAT (negative to absolute temperature) sensor that generates the sensed-temperature voltage $V_{NTAT}(T)$ according to the following Equation (1):

$$V_{NTAT}(T) \approx V_{VDDH} - \frac{R_3}{R_2+R_3}\left(\frac{R_2}{R_1}\frac{kT}{q}\ln(n) + \frac{R_2}{R_3}V_{BE,Q3}\right) \quad (1)$$

where $V_{VDDH}$ is the supply voltage VDDH, $R_1$, $R_2$, and $R_3$ are the resistances of the corresponding resistors, T is the absolute temperature in degrees Kelvin, k is the Boltzmann constant, q is the electron charge constant, n is the size ratio between the n-type bipolar transistors $Q_1$ and $Q_2$, and $V_{BE,Q3}$ is base-to-emitter voltage of the n-type bipolar transistor $Q_3$. A typical value for n is 8, although other suitable values are possible. The absolute $V_{NTAT}(T)$ value and its temperature slope ($TC_{V_{NTAT}}$) can be independently set via the resistors $R_2$ and $R_3$. As indicated by Equation (1), the sensed-temperature voltage $V_{NTAT}(T)$ decreases with increasing temperature, and vice versa.

Although the disclosure has been described in the context of the temperature sensor being an NTAT sensor, in alternative embodiments, other suitable types of temperature sensors may be used, such as a PTAT sensor with or without subsequent ADC stage and digital processing. Furthermore, in some alternative embodiments, two different temperature sensors are implemented: one to stabilize the frequency source 120 and another to determine the LUT-entry for the frequency divider 132.

Frequency Source

Figure 3:
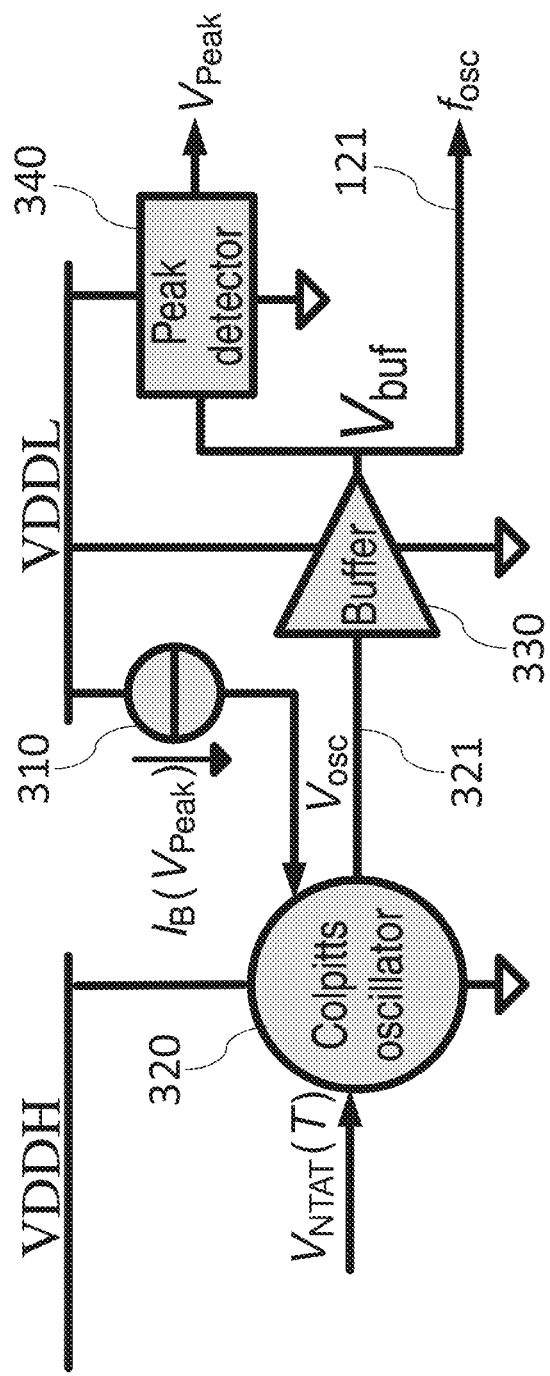
FIG. 3 is a block diagram of a frequency source that can be used to implement the frequency source of FIG. 1 according to certain embodiments of the disclosure.

FIG. 3 is a block diagram of a frequency source 300 that can be used to implement the frequency source 120 of FIG. 1 according to certain embodiments of the disclosure. As shown in FIG. 3, a current source 310 generates a bias current $I_B$ for a Colpitts oscillator 320, which also receives the sensed-temperature voltage $V_{NTAT}(T)$ from the temperature sensor 110 of FIG. 1 and generates, via a buffer 330, the oscillator signal 121 of FIG. 1 having the oscillator frequency $f_{osc}$ that is applied to the frequency-adjustment circuitry 130 of FIG. 1. The oscillator signal 121 is also applied to a peak detector 340 that generates a peak voltage signal $V_{Peak}$ that is dependent on the peak AC voltage level in the oscillator signal 121. The peak voltage signal $V_{Peak}$ is fed back and applied to the current source 310, which generates the bias current $I_B$ based on $V_{Peak}$.

As shown in the figures, the temperature sensor 200 of FIG. 2 and the Colpitts oscillator 320 of FIG. 3 operate in a first voltage domain driven at supply voltage VDDH, while the current source 310, the buffer 330, and the peak detector 340 of FIG. 3 operate in a second voltage domain driven by supply voltage VDDL, where VDDL may be the same or different from VDDH. Those skilled in the art will understand that, in some implementations, the frequency reference generator 100 of FIG. 1 will operate with greater accuracy and greater efficiency when VDDH is greater than VDDL.

Colpitts Oscillator

Figure 4:
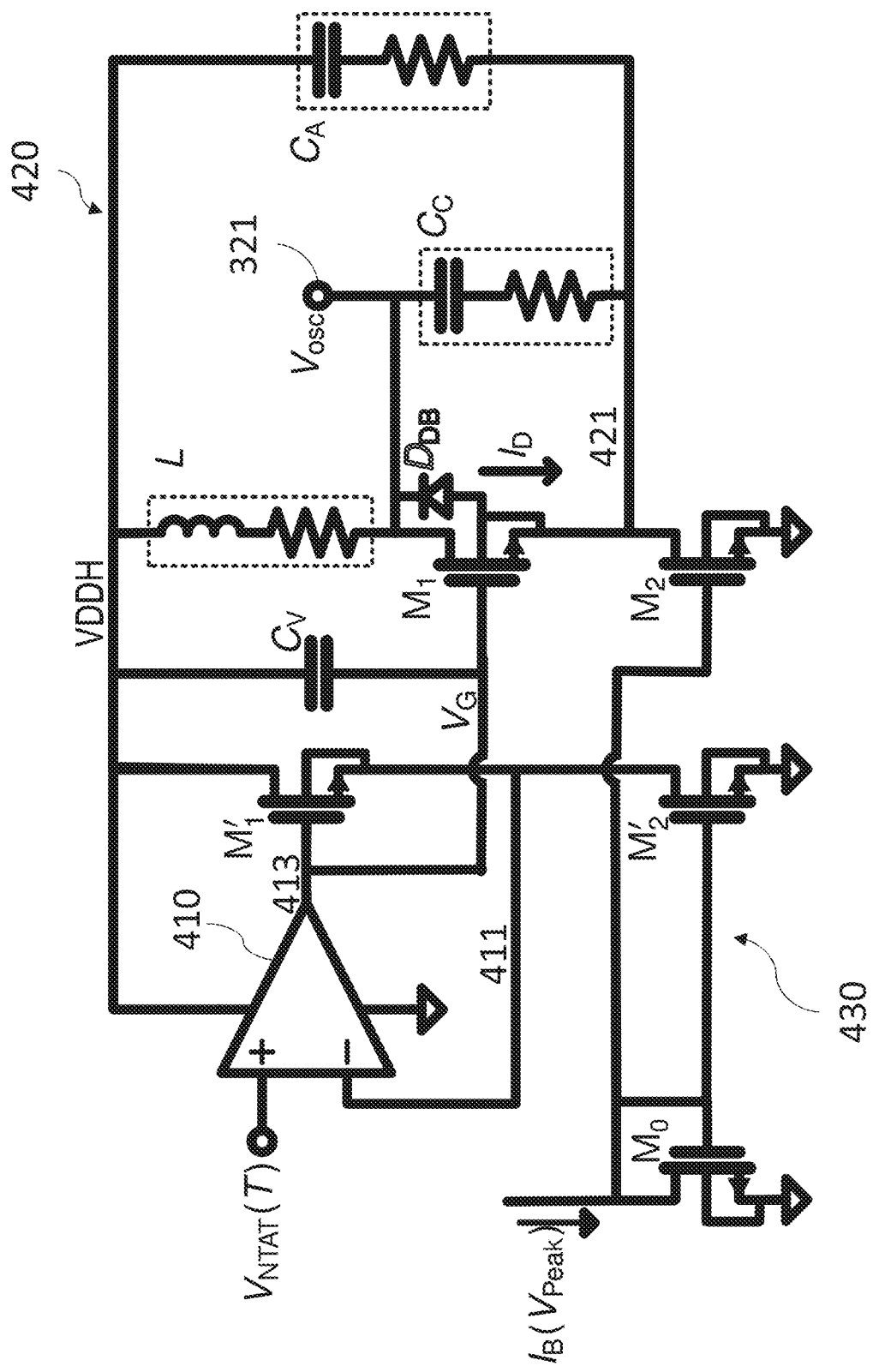
FIG. 4 is a schematic circuit diagram of a single-ended Colpitts oscillator that can be used to implement the Colpitts oscillator of FIG. 3 according to certain embodiments of the disclosure.

FIG. 4 is a schematic circuit diagram of a single-ended Colpitts oscillator 400 that can be used to implement the Colpitts oscillator 320 of FIG. 3 according to certain embodiments of the disclosure. As shown in FIG. 4, the Colpitts oscillator 400 has the following elements:

Operational amplifier (op-amp) 410;
Non-trimmable LC tank 420 consisting of a (passive, non-trimmable) inductor L and two (passive, non-trimmable) capacitors $C_A$ and $C_C$, all of which have inherent (aka parasitic) (passive, non-trimmable) resistance levels;

n-type transistor, LC-tank drive device $M_1$;

Capacitor Cv, which shorts the gate of the drive device $M_1$ to AC ground;

n-type transistor, replica device $M_1'$, which may be, but does not have to be a scaled down version of $M_1$; and Current mirror circuitry 430 consisting of n-type transistor devices $M_0$, $M_2'$, and $M_2$, where $M_2'$ may be, but does not have to be a scaled down version of $M_2$.

As used herein, the term "Colpitts oscillator" refers to an electronic oscillator (i.e., an LC oscillator) that uses a combination of inductors (L) and capacitors (C) to produce an oscillation at a certain frequency, where the feedback for the oscillator drive device is taken from a voltage divider made of two capacitors in series across an inductor. In the Colpitts oscillator 400 of FIG. 4, the feedback for the oscillator drive device (i.e., the device $M_1$) is the source voltage at node 421 of the voltage divider made of the capacitors $C_A$ and $C_C$ in series across the inductor L as long as the gate of $M_1$ is sufficiently AC-grounded. Those skilled in the art will understand that the Colpitts oscillator 400 of FIG. 4 is just one possible implementation of a Colpitts oscillator.

As used herein, the term "passive, non-trimmable" implies that the corresponding component (e.g., a capacitor, inductor, or resistor) has characteristic features (e.g., capacitance, inductance, and/or resistance) that cannot be actively controlled either with a one-time factory trim or by on-line compensation in the field. Note that those characteristic features may, however, inherently vary with process, voltage, temperature, and lifetime.

In operation, the op-amp 410 generates an output voltage CE as a function of the difference between the voltage level of the sensed-temperature voltage $V_{NTAT}(T)$ from the temperature sensor 110 of FIG. 1 and the source voltage 411 of the replica device $M_1'$. The op-amp output voltage 413 is applied to the gates of the LC-tank drive device $M_1$ and the replica device $M_1'$. The drain of the drive device $M_1$, which includes a parasitic drain-to-bulk junction diode $D_{DB}$, is connected to the LC tank 420, which resonates to generate the oscillator signal 321 of FIG. 3. The bias current $I_B(V_{Peak})$ from the current source 310 of FIG. 3 is applied to transistor $M_0$ and mirrored in both (i) the transistor $M_2$, which is connected in cascode to the drive device $M_1$, and (ii) the transistor $M_2'$, which is connected in cascode to the replica device $M_1'$.

During steady-state operation, the op-amp output signal 413 at least partially turns on the drive device $M_1$, which causes the LC tank 420 to resonate (given that the transconductance of $M_1$ and therefore the bias current $I_B$ are sufficiently large), thereby generating the oscillator signal 321. As described above, as temperature decreases, the voltage level of the sensed-temperature voltage $V_{NTAT}(T)$ from the temperature sensor 110 of FIG. 1 increases, which is mirrored to the source of $M_1$ via the op amp 410 and the replica device $M_1'$, which will tune the junction capacitance $C_{DB}$ to compensate for variation over temperature, and vice versa. In some alternative embodiments, the op amp 410 is omitted, and the sensed-temperature voltage $V_{NTAT}(T)$ is applied directly to the drive device $M_1$ and to the replica device $M_1'$.

The purpose of the replica transistors $M_1'$ and $M_2'$ is to mirror the DC voltage levels at the transistor $M_1$. The capacitance $C_{DB}$ of the junction diode $D_{DB}$ of the drive device $M_1$, which is in parallel with the (smaller) tank capacitor $C_C$, is PVT-sensitive. Due to the inductor L, the DC voltage level at the drain of the drive device $M_1$ will track the voltage level VDDH. At the same time, the op-amp 410 and the mirror circuitry 430 ensures that changes in the voltage level VDDH will be tracked at the source of the drive device $M_1$. In particular, the sensed-temperature voltage $V_{NTAT}$, copied to the negative terminal of $C_{DB}$ (i.e., the cathode of the diode $D_{DB}$) by the op-amp 410 and the replica device $M_1'$, tracks the supply voltage VDDH at the positive terminal of $C_{DB}$ (i.e., the anode of the diode $D_{DB}$). As such, the total (parasitic) capacitance is kept relatively constant over expected variations in the supply voltage level VDDH, and the operation of the Colpitts oscillator 320 of FIG. 3 and thereby the frequency reference generator 100 of FIG. 1 will be substantially independent of such voltage variations. Meanwhile, the temperature-compensation circuitry (e.g., $V_{NTAT}$, $M_1'$, 410) ensures a substantially constant capacitance over temperature and substantially constant capacitor temperature coefficients over process for a parasitic diode of the drive device $M_1$, and thereby the frequency temperature coefficient of the frequency reference generator 100 of FIG. 1 will be substantially insensitive to process variations.

Those skilled in the art will understand that, instead of the Colpitts oscillator 320 of FIG. 3 being implemented using the single-ended Colpitts oscillator 400 of FIG. 4, a differential Colpitts oscillator can be employed to generate a differential frequency reference signal. Furthermore, instead of using a non-trimmable single-ended or differential Colpitts oscillator, other suitable types of non-trimmable single-ended or differential oscillators, such as (without limitation) Hartley, Pierce, or Clapp oscillators, can be used to implement the frequency source 120 of FIG. 1.

Buffer

Figure 5:
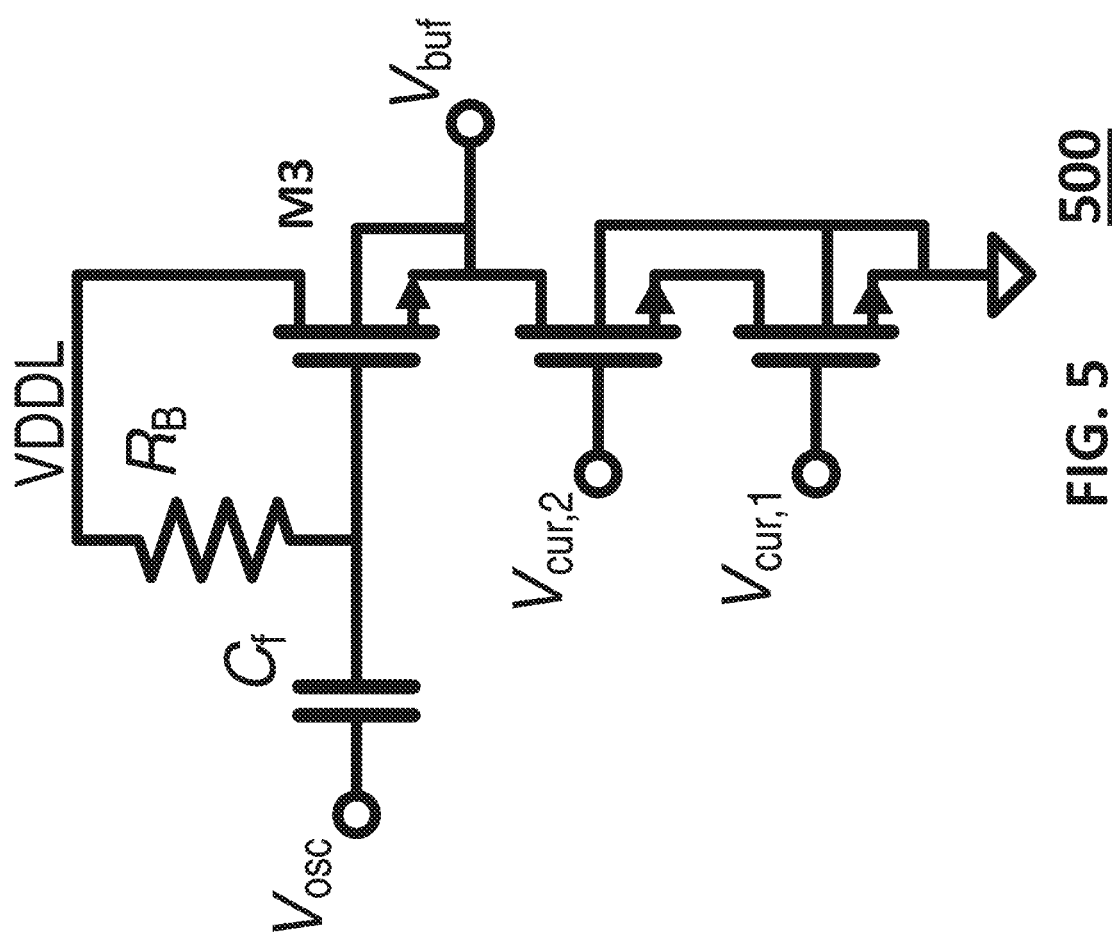
FIG. 5 is a schematic circuit diagram of a buffer that can be used to implement the buffer of FIG. 3 according to certain embodiments of the disclosure.

FIG. 5 is a schematic circuit diagram of a buffer 500 that can be used to implement the buffer 330 of FIG. 3 according to certain embodiments of the disclosure. The buffer 500 is a source follower buffer with cascode current source. The buffer 500 converts the Colpitts oscillator output $V_{osc}$ in the VDDH voltage domain into the buffer output $V_{buf}$ in the VDDL voltage domain, while maintaining the same frequency $f_{osc}$. The buffer 500 isolates the oscillator core from succeeding circuitry and hence reduces parasitic capacitances. In some implementations, the buffer 500 may be extended with subsequent frequency division, e.g., a first few stages of a divider chain prior to the frequency divider 132 of FIG. 1.

Peak Detector

Figure 6:
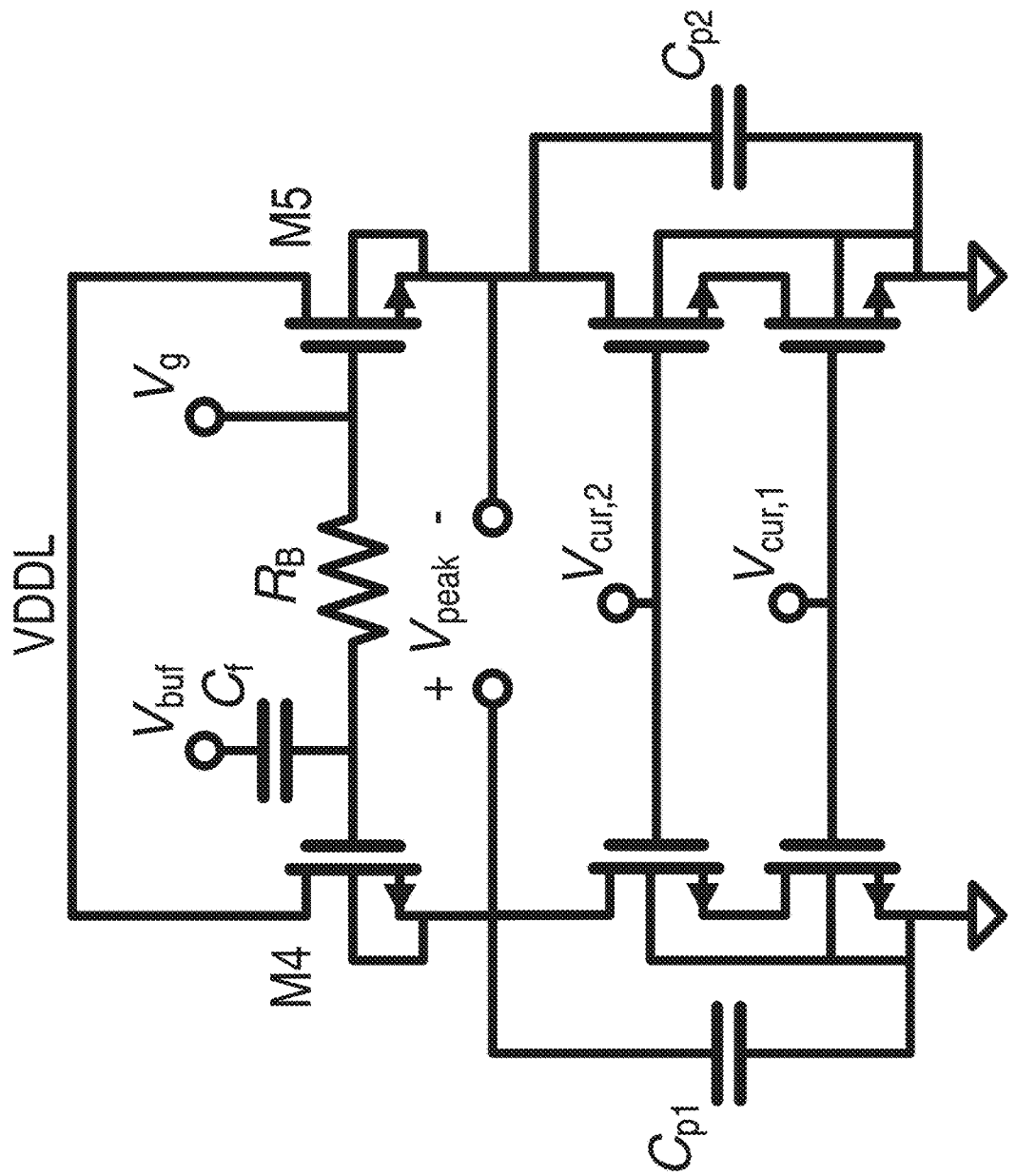
FIG. 6 is a schematic circuit diagram of a peak detector that can be used to implement the peak detector of FIG. 3 according to certain embodiments of the disclosure.

FIG. 6 is a schematic circuit diagram of a peak detector 600 with common-mode input rejection that can be used to implement the peak detector 340 of FIG. 3 according to certain embodiments of the disclosure. During the half cycle that the buffer output $V_{buf}$ from the buffer 330 of FIG. 3 is positive, the n-type transistor device M4 is on, operating as a source follower that charges the capacitor $C_{p1}$, and hence the peak detector output $V_{Peak}$ tracks the peak of the buffer output $V_{buf}$ of FIG. 3 with possibly a linear (or first-order) attenuation factor within a specified input voltage amplitude range. During the other half cycle when the buffer output $V_{buf}$ is negative, M4 is off, and the output $V_{Peak}$ slowly droops from the peak value to a somewhat smaller value (e.g., $V_{min}$). As a result, the output $V_{Peak}$ ripples between the peak value and $V_{min}$. The dc offset caused by the gate bias $V_g$ is removed in the differential output $V_{Peak}$ by introducing a replica stage comprising an equivalent n-type transistor device M5 and an equivalent capacitor $C_{p2}$. The replica device M5, and its DC-voltages, tracks M4, and its DC-voltages, over PVT-variation. Note that (i) the devices M4 and M5 work in weak inversion and (ii) the capacitance of $C_{p1}$ and $C_{p2}$ and the transconductance of M4 and M5 should be properly chosen such that the output ripple in $V_{Peak}$ is reasonably small. The buffer output $V_{buf}$ is a buffered signal of the oscillator output $V_{osc}$. As mentioned above, the peak detector device M4 will act as a source follower, but, at some point, the charge injected per period ($1/f_{osc}$) will be equal to the amount that is subtracted from the capacitor $C_{p1}$ by the current sources at the bottom of FIG. 6.

Current Source

Figure 7:
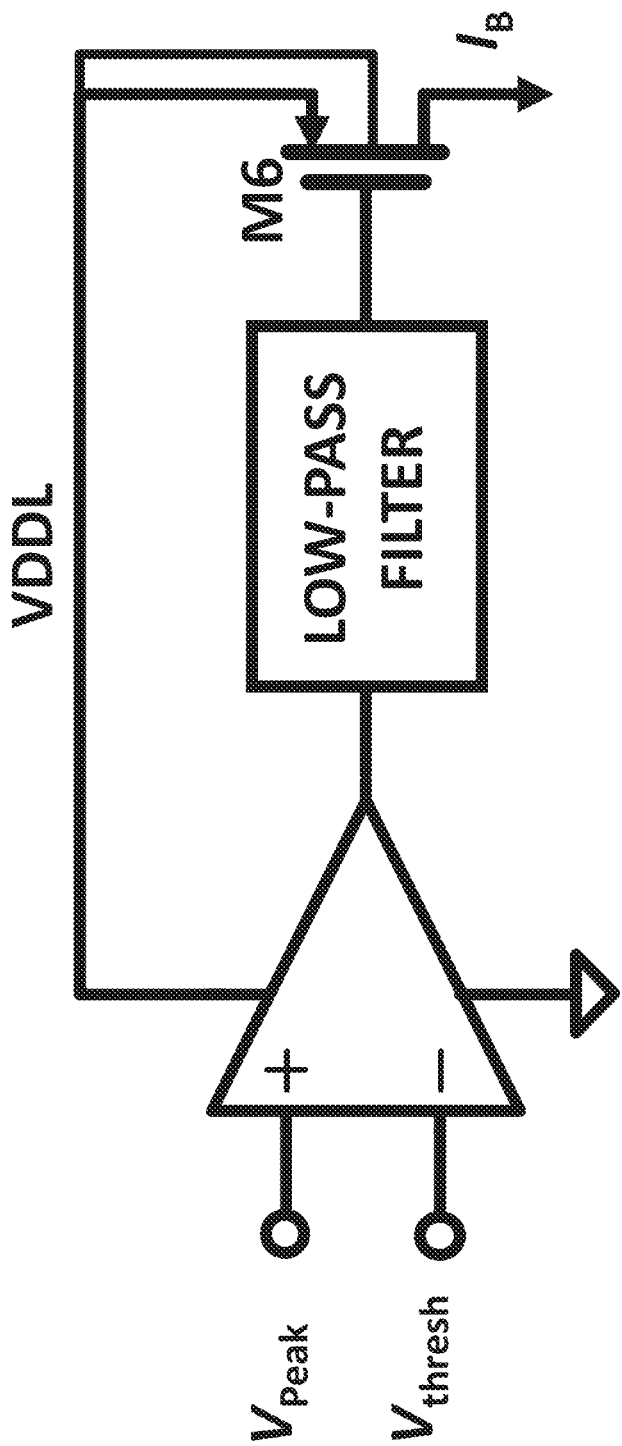
FIG. 7 is a schematic circuit diagram of a current source that can be used to implement the current source of FIG. 3 according to certain embodiments of the disclosure.

FIG. 7 is a schematic circuit diagram of a current source 700 that can be used to implement the current source 310 of FIG. 3 according to certain embodiments of the disclosure. When the peak detector output $V_{Peak}$ increases above the specified threshold voltage ($V_{thresh}$), the differential input is amplified, low-pass filtered, and applied to the gate of the PMOS current source M6. As a result, the gate-to-source voltage $V_{GS}$ of M6 decreases, and hence the bias current $I_B$ and the peak voltage $V_{Peak}$ will drop. When $V_{Peak} < V_{thresh}$, the $V_{GS}$ of M6 increases, and hence $I_B$ and the $V_{Peak}$ will rise. Therefore, during the steady-state operation, $V_{Peak}$ is regulated to the specified $V_{thresh}$.

Note that the peak detector output $V_{Peak}$ of FIG. 6 is a differential signal, while the peak voltage input $V_{Peak}$ of FIG. 7 is single-ended. Those skilled in the art will understand how to convert the differential output signal of FIG. 6 into the single-ended input signal of FIG. 7.

Frequency Divider

Figure 8:
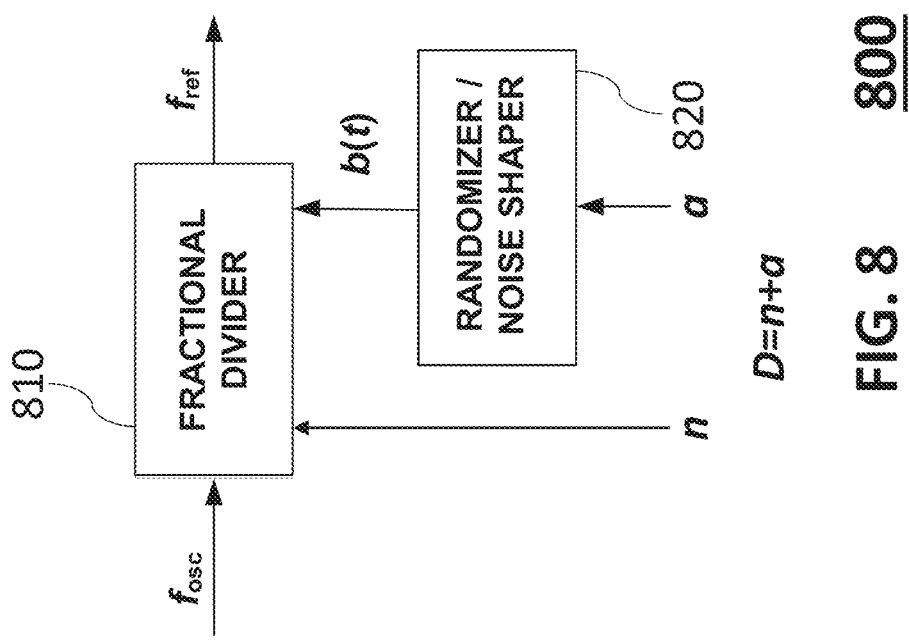
FIG. 8 is a schematic circuit diagram of a frequency divider that can be used to implement the frequency divider of FIG. 1 according to certain embodiments of the disclosure.

FIG. 8 is a schematic circuit diagram of a frequency divider 800 that can be used to implement the frequency divider 132 of FIG. 1 according to certain embodiments of the disclosure. Frequency divider 800 comprises a fractional frequency divider 810 and a randomizer/noise shaper 820. A fractional frequency divider is a component that divides the frequency of an incoming signal by a fractional divisor value D on average over time. In general, for the frequency divider 800 of FIG. 8, the divisor value D is a positive number having an integer portion n and a fractional portion a. One type of fractional frequency divider is a dual-modulus frequency divider, which divides the frequency of an incoming signal by the integer value n a certain fraction of the time and by the next larger integer value (n+1) the rest of the time, where the fractional value a determines the fraction of time that the dual-modulus frequency divider divides the frequency $f_{osc}$ of the incoming signal by (n+1). For example, using a dual-modulus frequency divider for the fractional frequency divider 810, if the divisor value D is 3.2, then n=3 and a=0.2, where the dual-modulus frequency divider 810 will frequency divide the incoming signal by (n+1=4) 20 percent of the time and by (n=3) 80 percent of the time.

The randomizer/noise shaper 820 determines specific, randomized, short time periods b(t) for the fractional frequency divider 810 to frequency divide the incoming signal by different integer divisor values (e.g., n−1, n, and n+1) such that the time-average divisor value will be the fractional divisor value D, where the resulting noise spectrum is engineered by the noise shaper to shift the majority of the energy to larger frequency offsets with respect to the resulting reference frequency $f_{ref}$. In this way, the frequency divider 800 performs fractional spur suppression. In certain implementations, the fractional frequency divider 810 divides the frequency of the incoming signal by n+b(t), where b(t) is 0, when the frequency is to be divided by n and b(t) is 1, when the frequency is to be divided by n+1. In some applications, the frequency should be higher-order noise shaped, where the noise-shaper order and topology determine the number of different integer divisor values needed.

Those skilled in the art will understand that there are other suitable techniques for implementing the frequency-adjustment circuitry 130 of FIG. 1, including, without limitation, multi-modulus and other types of frequency division and frequency counting. In the case of a frequency counting, a look-up table that maps different operating temperatures to corresponding counter threshold values would be employed instead of the LUT of FIG. 1. At least one frequency counter that can be used in alternative embodiments of this disclosure is the comparison circuit 131 described in U.S. patent application publication no. 2019/0028106 A1, the teachings of which are incorporated herein by reference in their entirety.

Design Considerations

Referring again to FIG. 1, the frequency reference generator 100 has two main parts: (i) the LC-based frequency source 120 with well-behaved $TC_f$ over process and lifetime and (ii) the standalone frequency-adjustment circuitry 130 outside of the frequency source 120. To obtain well-defined $TC_f$ over process and time, the influence of doped semiconductors (such as poly-resistors, transistors, and diodes) on the oscillation frequency is minimized. Therefore, the class of LC-based oscillators is employed since the oscillation frequency is mainly determined by the value of L and C, both of which can be easily implemented in the metal back-end. Further, the $TC_f$ contribution from the temperature/process-sensitive quality factor of the LC tank is reduced, and the LC tank (e.g., 420 of FIG. 4) is non-trimmable to exclude lossy and PVT-sensitive tuning/switching components.

Nominal frequency trimming and temperature compensation outside of the frequency source 120 can be accomplished using a look-up table and the frequency divider 132. In addition, the process spread of $TC_f$ contributed by transistor parasitics (e.g., varying junction capacitance) is minimized. Consequently, the frequency reference generator 100 requires only 1T-trim per sample and batch calibration using a fixed temperature compensation polynomial or other suitable mapping.

At lower-GHz frequencies, the oscillation frequency $f_{osc}$ of the single-ended Colpitts oscillator 400 of FIG. 4 (including the Groszkowski effect described in J. Groszkowski, *Frequency of Self-Oscillations*, Oxford: Pergamon Press, 1964, the teachings of which are incorporated herein by reference in their entirety) can be approximated as follows:

$$f_{osc} \approx \frac{1}{2\pi\sqrt{LC_S}} \sqrt{1 + \frac{1}{Q_L}\left(\frac{1}{Q_{C_A}} + \frac{1}{Q_{C_C}}\right) - \frac{1}{Q_L^2}\sum_{n=2}^{\infty} \frac{1}{n^2-1} h_n^2}$$

where L is the inductance of the inductor L, $C_S$ is the effective capacitance of the LC tank 420 (i.e., $C_S = C_A C_C/(C_A + C_C)$), $Q_L$ is the quality factor for the inductor L, $Q_{C_A}$ is the quality factor for the capacitor $C_A$, $Q_{C_C}$ is the quality factor for the capacitor $C_C$, and $h_n = I_{Dn}/I_{D1}$ is the relative $n^{th}$-order harmonic content in the sustaining current $I_D$ as shown in FIG. 4.

For the Colpitts oscillator 400 of FIG. 4, the $TC_f$ contribution from the temperature-sensitive quality factor of the LC tank 420 (assuming $Q_L = Q_{C_A} = Q_{C_C}$) is proportional to $2/(Q_C Q_L)$. This is inherently a factor $Q_C/(2Q_L)$ better than the cross-coupled LC tank 420 at lower-GHz frequencies, where $Q_L \ll Q_C$. To exploit this property, the layout of the LC tank 420 should be optimized to maximize $Q_{C_A}$ and $Q_{C_C}$ (e.g., a few hundred at 1-2 GHz in a typical modern CMOS process) for an improvement (i.e., $Q_C/(2Q_L)$) on the order of 10 in a typical modern CMOS process in the $TC_f$ LC-tank quality factor term.

To minimize frequency drift due to the Groszkowski effect on $f_{osc}$, low amplitudes of $V_{osc}$ (<200 mV in a typical modern CMOS process) in steady state should be maintained to ensure that the drive device $M_1$ is kept close to its bias point. In practice, oscillation amplitude control is achieved by measuring the peak detector output $V_{Peak}$ and adjusting the bias current $I_B$ accordingly.

With the aforementioned design considerations and measures, the temperature-dependent tank inductance and capacitance dominate the residual $TC_f$. The effective tank capacitance is influenced by the PVT-sensitive parasitic capacitances of $M_1$ and $M_2$. The design choice of $C_A/C_C$ is a compromise between (i) the influence of the parasitic capacitances on $C_A$ and (ii) the transconductance and current consumption of transistor $M_1$ for oscillation. $M_1$ contains the parasitic bulk-drain junction diode $D_{DB}$, of which its capacitance $C_{DB}$ is PVT-sensitive and is in parallel with (the smaller) tank capacitance $C_C$. As shown in FIG. 4, these dependencies of $C_{DB}$ are minimized by forcing a suitable sensed-temperature voltage $V_{NTAT}$ on the source of $M_1$, implemented by the replica circuit of $M_1'$ and $M_2'$ and the op-amp 410.

Simulation Results

FIGS. 9A and 9B show simulated $C_{DB}$ versus temperature (i) with constant 1-V gate voltage $V_G$ and (ii) with temperature-compensated gate voltage $V_G(T)$, respectively, over process corners. Simulations show that the temperature-compensation technique described herein reduces the $C_{DB}$-variation over temperature by a factor of 6, which translates directly to a similar reduction of the frequency drift and its spread. The well-defined residual frequency drift of the Colpitts oscillator 400 of FIG. 4 can be compensated using a 3rd-order polynomial in the temperature-to-divisor value compensation of the frequency divider 132.

FIGS. 10A-10C show measured $f_{osc}$ and its frequency deviation over temperature and supply voltage for 16 samples. The uncompensated frequency accuracy from −50° C. to 170° C. is within ±5500 ppm (see FIG. 10B), yielding process-insensitive $TC_f$=44.5 ppm/° C. (box method). Over 2.5±10% V unregulated supply range, the frequency error is less than 60 ppm (i.e., 220 ppm/V).

FIGS. 11A-11B show measured frequency deviations after applying the temperature correction polynomials and after 1T-trimming at room temperature for 16 samples. Using the internal temperature sensor 110, the worst-case frequency error stays within ±120 ppm from −50° C. to 170° C., yielding $TC_f$=1.0 ppm/° C. (box-method). With an external PT100 as the temperature sensor, to measure the ambient chip temperature, the frequency error stays within ±70 ppm.

ALTERNATIVE EMBODIMENTS

As used herein, the term "trimming" refers to an off-line, static adjustment made to circuitry that affects the on-line operations of that circuitry, while the term "compensation" refers to an on-line, dynamic adjustment made to circuitry that affects the on-line operations of that circuitry. Thus, the off-line generation of a sample-specific LUT for the frequency-adjustment circuitry 130 of FIG. 1 to account for process variation is an example of trimming, while the use of that sample-specific LUT during on-line operations of the frequency-adjustment circuitry 130 to account for temperature variation is an example of compensation. Similarly, the use of the replica circuitry $M_1'$ and $M_2'$ in the Colpitts oscillator 400 of FIG. 4 to account for voltage and temperature variation is another example of compensation.

The frequency reference generator 100 of FIGS. 1-8 has temperature sensor 110, frequency source 120, and frequency-adjustment circuitry 130. The frequency source 120 has a non-trimmable drive device $M_1$, a non-trimmable LC tank 420, and replica circuitry $M_1'$ and $M_2'$ that compensates for voltage and temperature variation. The frequency-adjustment circuitry 130 is one-time (1T) trimmable for process variation and compensates for temperature variation. Those skilled in the art will understand that, in alternative embodiments, frequency reference generators of the disclosure may have a trimmable device driver $M_1$ and/or a trimmable LC tank. For example, suitable trimming circuitry for a trimmable device driver $M_1$ may include a switchable transistor array with on/off switches implemented at the gate terminals. In some embodiments, the current mirror transistor $M_2$ may also be trimmable. Suitable trimming circuitry for an LC tank may include two or more one-time programmable capacitors connected in parallel for one or both of the capacitors $C_A$ and $C_C$ of FIG. 4, where the LC tank is 1T-trimmed by permanently connecting or disconnect each programmable capacitor to or from the LC tank. In certain implementations, the frequency error introduced by the trimming circuitry is at least one order of magnitude less that the frequency error of the untrimmed LC tank.

Although the disclosure has been described in terms of the frequency source 120 having a resonant LC tank, those skilled in the art will understand that, in alternative embodiments, the frequency source may have a suitable resonant non-LC tank such as tuned transformers and quarter-wavelength transmission lines.

Although the disclosure has been described in the context of the frequency source 120 having a peak detector 340 and a current source 310 that generates a bias current $I_B$ based on the detected peak voltage $V_{Peak}$ in the buffer output $V_{buf}$, in other embodiments, other suitable types of amplitude detectors and amplitude-based bias current sources may be employed.

Although the disclosure has been described in the context of an oscillator having current-mirror circuitry 430, in alternative embodiments, other suitable circuitry may be used to drive a current into the drive device $M_1$ based on the bias current.

According to certain embodiments, the disclosure describes an article of manufacture comprising a frequency reference generator (e.g., 100) that generates a frequency reference signal (e.g., 133) having a reference frequency (e.g., $f_{ref}$). The frequency reference generator comprises an integrated frequency source (e.g., 120), at least one temperature sensor (e.g., 110), and a frequency-adjustment circuit (e.g., 130). The integrated frequency source comprises a resonant tank (e.g., 420) and drive circuitry (e.g., $M_1$, 410, 430) that drives the resonant tank to generate an oscillator signal (e.g., 121) having an oscillator frequency (e.g., $f_{osc}$). The at least one temperature sensor (e.g., 110) generates at least one measured temperature signal (e.g., $V_{NTAT}(T)$). The frequency-adjustment circuit (e.g., 130) adjusts the oscillator frequency of the oscillator signal based on one of the at least one measured temperature signal to generate the frequency reference signal having the reference frequency.

According to at least some of the above embodiments, the drive circuitry drives the resonant tank based on one of the at least one measured temperature signal.

According to at least some of the above embodiments, the integrated frequency source further comprises an amplitude detector (e.g., 340) that generates a detected amplitude signal (e.g., $V_{Peak}$) based on the oscillator signal and a current source (e.g., 310) that generates a bias current (e.g., $I_B$) for the drive circuitry of the integrated frequency source based on the detected amplitude signal.

According to at least some of the above embodiments, the integrated frequency source further comprises an oscillator (e.g., 320) having the resonant tank and the drive circuitry and a current source (e.g., 310) that generates a bias current (e.g., $I_B$) for the drive circuitry. The drive circuitry comprises a tank drive device (e.g., $M_1$) connected to the resonant tank and bias circuitry (e.g., 430) that defines current into the drive device based on the bias current.

According to at least some of the above embodiments, the oscillator is a Colpitts or Hartley oscillator.

According to at least some of the above embodiments, the drive circuitry further comprises a replica device (e.g., $M_1'$) that (i) enables a substantially constant voltage drop to be maintained across a parasitic diode of the drive device for different power supply voltage levels and (ii) ensures a substantially constant capacitance over temperature for the parasitic diode of the drive device.

According to at least some of the above embodiments, the bias circuitry is current mirror circuitry that mirrors the bias current into the replica device such that a voltage variation at the source of the drive device tracks a voltage variation at the drain of the drive device to reduce dependence of the integrated frequency source on power supply voltage variations.

According to at least some of the above embodiments, the drive circuitry further comprises an amplifier (e.g., 410) that controls the drive device based on the measure temperature signal.

According to at least some of the above embodiments, the bias circuitry is current mirror circuitry that mirrors the bias current into the drive device.

According to at least some of the above embodiments, the frequency-adjustment circuit comprises memory containing a look-up table (e.g., 134, 136) that maps the measured temperature signal to a specified divisor value (e.g., D) and a frequency divider (e.g., 132) that generates the frequency reference signal based on the oscillator frequency of the oscillator signal and the specified divisor value.

According to at least some of the above embodiments, the mapping is based on a sample-agnostic mapping of temperature values to divisor values generated based on sample-specific mappings of temperature values to divisor values for a number of example samples.

According to at least some of the above embodiments, the mapping is a specific mapping that is further based on a sample-specific measured divisor value at a specific temperature.

According to at least some of the above embodiments, the specified divisor value is a fractional divisor value, and the frequency divider comprises a fractional frequency divider (e.g., 810) that selectively divides the oscillator frequency of the oscillator signal by a specified integer value and divider-control circuitry (e.g., 820) that controls the selection of different integer values for the fractional frequency divider such that, on average over time, the fractional frequency divider divides the oscillator frequency by the fractional divisor value.

According to at least some of the above embodiments, the divider-control circuitry performs fractional spur suppression.

According to at least some of the above embodiments, the frequency-adjustment circuit comprises memory containing a look-up table that maps the measured temperature signal to a specified counter threshold and a frequency counter that generates the frequency reference signal based on the oscillator frequency of the oscillator signal and the specified counter threshold.

According to at least some of the above embodiments, the mapping is based on a sample-agnostic mapping of temperature values to counter threshold values generated based on sample-specific mappings of temperature values to counter threshold values for a number of example samples.

According to at least some of the above embodiments, the mapping is a specific mapping that is further based on a sample-specific measured counter threshold at a specific temperature.

According to at least some of the above embodiments, the drive device and the resonant tank are non-trimmable.

According to at least some of the above embodiments, at least one of the drive device and the resonant tank is trimmable.

It is further noted that the functional blocks, components, systems, devices, or circuitry described herein can be implemented using hardware, software, or a combination of hardware and software along with analog circuitry as needed. For example, the disclosed embodiments can be implemented using one or more integrated circuits that are programmed to perform the functions, tasks, methods, actions, or other operational features described herein for the disclosed embodiments. The one or more integrated circuits can include, for example, one or more processors or configurable logic devices (CLDs) or a combination thereof. The one or more processors can be, for example, one or more central processing units (CPUs), controllers, microcontrollers, microprocessors, hardware accelerators, ASIC s (application specific integrated circuit), or other integrated processing devices. The one or more CLDs can be, for example, one or more CPLDs (complex programmable logic devices), FPGAs (field programmable gate arrays), PLAs (programmable logic array), reconfigurable logic circuits, or other integrated logic devices. Further, the integrated circuits, including the one or more processors, can be programmed to execute software, firmware, code, or other program instructions that are embodied in one or more non-transitory tangible computer-readable mediums to perform the functions, tasks, methods, actions, or other operational features described herein for the disclosed embodiments. The integrated circuits, including the one or more CLDs, can also be programmed using logic code, logic definitions, hardware description languages, configuration files, or other logic instructions that are embodied in one or more non-transitory tangible computer-readable mediums to perform the functions, tasks, methods, actions, or other operational features described herein for the disclosed embodiments. In addition, the one or more non-transitory tangible computer-readable mediums can include, for example, one or more data storage devices, memory devices, flash memories, random access memories, read only memories, programmable memory devices, reprogrammable storage devices, hard drives, floppy disks, DVDs, CD-ROMs, or any other non-transitory tangible computer-readable mediums. Other variations can also be implemented while still taking advantage of the techniques described herein.

Signals and corresponding terminals, nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. An article of manufacture comprising a frequency reference generator that generates a frequency reference signal having a reference frequency, the frequency reference generator comprising:
    an integrated frequency source comprising a resonant tank and drive circuitry that drives the resonant tank to generate an oscillator signal having an oscillator frequency;
    at least one temperature sensor that generates at least one measured temperature signal; and
    a frequency-adjustment circuit that adjusts the oscillator frequency of the oscillator signal based on one of the at least one measured temperature signal to generate the frequency reference signal having the reference frequency.

2. The article of claim 1, wherein the drive circuitry drives the resonant tank based on one of the at least one measured temperature signal.

3. The article of claim 1, wherein the integrated frequency source further comprises:
    an amplitude detector that generates a detected amplitude signal based on the oscillator signal; and
    a current source that generates a bias current for the drive circuitry of the integrated frequency source based on the detected amplitude signal.

4. The article of claim 1, wherein:
    the integrated frequency source further comprises:
        an oscillator having the resonant tank and the drive circuitry; and
        a current source that generates a bias current for the drive circuitry; and
    the drive circuitry comprises:
        a tank drive device connected to the resonant tank; and
        bias circuitry that defines current into the drive device based on the bias current.

5. The article of claim 4, wherein the oscillator is a Colpitts or Hartley oscillator.

6. The article of claim 4, wherein the drive circuitry further comprises a replica device that (i) enables a substantially constant voltage drop to be maintained across a parasitic diode of the drive device for different power supply voltage levels and (ii) ensures a substantially constant capacitance over temperature for the parasitic diode of the drive device.

7. The article of claim 4, wherein the bias circuitry is current mirror circuitry that mirrors the bias current into the replica device such that a voltage variation at the source of the drive device tracks a voltage variation at the drain of the drive device to reduce dependence of the integrated frequency source on power supply voltage variations.

8. The article of claim 4, wherein the drive circuitry further comprises an amplifier that controls the drive device based on the measure temperature signal.

9. The article of claim 4, wherein the bias circuitry is current mirror circuitry that mirrors the bias current into the drive device.

10. The article of claim 1, wherein the frequency-adjustment circuit comprises:
    memory containing a look-up table that maps the measured temperature signal to a specified divisor value; and
    a frequency divider that generates the frequency reference signal based on the oscillator frequency of the oscillator signal and the specified divisor value.

11. The article of claim 10, wherein the mapping is based on a sample-agnostic mapping of temperature values to divisor values generated based on sample-specific mappings of temperature values to divisor values for a number of example samples.

12. The article of claim 11, wherein the mapping is a specific mapping that is further based on a sample-specific measured divisor value at a specific temperature.

13. The article of claim 10, wherein:
    the specified divisor value is a fractional divisor value; and
    the frequency divider comprises:
        a fractional frequency divider that selectively divides the oscillator frequency of the oscillator signal by a specified integer value; and
        divider-control circuitry that controls the selection of different integer values for the fractional frequency divider such that, on average over time, the fractional frequency divider divides the oscillator frequency by the fractional divisor value.

14. The article of claim 13, wherein the divider-control circuitry performs fractional spur suppression.

15. The article of claim 1, wherein the frequency-adjustment circuit comprises:
    memory containing a look-up table that maps the measured temperature signal to a specified counter threshold; and
    a frequency counter that generates the frequency reference signal based on the oscillator frequency of the oscillator signal and the specified counter threshold.

16. The article of claim 15, wherein the mapping is based on a sample-agnostic mapping of temperature values to counter threshold values generated based on sample-specific mappings of temperature values to counter threshold values for a number of example samples.

17. The article of claim 16, wherein the mapping is a specific mapping that is further based on a sample-specific measured counter threshold at a specific temperature.

18. The article of claim 1, wherein the drive device and the resonant tank are non-trimmable.

19. The article of claim 1, wherein at least one of the drive device and the resonant tank is trimmable.

* * * * *